(12) United States Patent
Hellig et al.

(10) Patent No.: US 6,828,240 B2
(45) Date of Patent: Dec. 7, 2004

(54) METHOD OF MANUFACTURING MULTI-LEVEL CONTACTS BY SIZING OF CONTACT SIZES IN INTEGRATED CIRCUITS

(75) Inventors: Kay Hellig, Dresden (DE); Massud Aminpur, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 246 days.

(21) Appl. No.: 10/210,995

(22) Filed: Aug. 2, 2002

(65) Prior Publication Data

US 2004/0023499 A1 Feb. 5, 2004

(51) Int. Cl.[7] .............................................. H01L 21/311
(52) U.S. Cl. ...................................... 438/700; 438/724
(58) Field of Search .................................. 438/700, 706, 438/710, 723, 724, 427

(56) References Cited

U.S. PATENT DOCUMENTS

| | | | |
|---|---|---|---|
| 5,317,193 A | 5/1994 | Watanabe | |
| 5,814,547 A * | 9/1998 | Chang | 438/329 |
| 6,207,534 B1 * | 3/2001 | Chan et al. | 438/427 |
| 6,211,058 B1 * | 4/2001 | Wang et al. | 438/620 |
| 6,211,059 B1 * | 4/2001 | Inoue et al. | 438/620 |
| 6,294,423 B1 * | 9/2001 | Malik et al. | 438/241 |
| 6,380,087 B1 | 4/2002 | Gupta et al. | |
| 6,566,191 B2 * | 5/2003 | Hsu et al. | 438/243 |

FOREIGN PATENT DOCUMENTS

| JP | 05121369 A | 5/1993 | |
|---|---|---|---|
| JP | 405267251 | * 10/1993 | ......... H01L/21/302 |

* cited by examiner

Primary Examiner—Kin-Chan Chen
(74) Attorney, Agent, or Firm—Mikio Ishimaru

(57) ABSTRACT

A method for forming an integrated circuit includes etching a first opening to a first depth in a dielectric material over a semiconductor device on a first semiconductor substrate and etching a second opening to a second depth in the dielectric material over the first semiconductor substrate. The first and second openings are differently sized to respectively etch to the first and second depths in about the same time due to etch lag. The first and second openings are filled with conductive material.

18 Claims, 4 Drawing Sheets

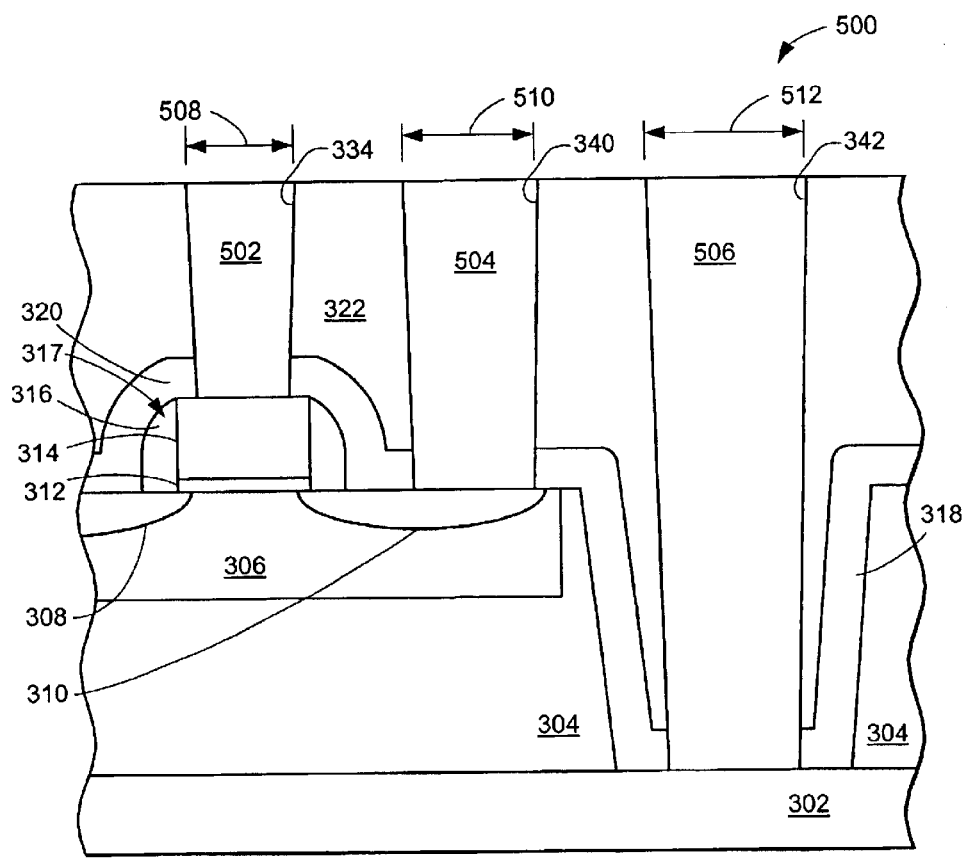

FIG. 5

| ETCHING A FIRST OPENING TO A FIRST DEPTH IN A DIELECTRIC MATERIAL OVER A SEMICONDUCTOR DEVICE ON A FIRST SEMICONDUCTOR SUBSTRATE 602 |
|---|
| ETCHING A SECOND OPENING TO A SECOND DEPTH IN THE DIELECTRIC MATERIAL OVER THE FIRST SEMICONDUCTOR SUBSTRATE, THE FIRST AND SECOND OPENINGS DIFFERENTLY SIZED TO RESPECTIVELY ETCH TO THE FIRST AND SECOND DEPTHS IN ABOUT THE SAME TIME DUE TO ETCH LAG 604 |
| FILLING THE FIRST AND SECOND OPENINGS WITH CONDUCTIVE MATERIAL 606 |

FIG. 6 ↖ 600

METHOD OF MANUFACTURING MULTI-LEVEL CONTACTS BY SIZING OF CONTACT SIZES IN INTEGRATED CIRCUITS

BACKGROUND

1. Technical Field

The present invention relates generally to integrated circuits and more particularly to contacts formed down to active regions under a dielectric layer.

2. Background Art

Integrated circuits are used in most electronic devices such as computers, radios, TV's, cell phones, etc. The hearts of these integrated circuits are semiconductor devices, which can be transistors, diodes, capacitors, etc. The semiconductor devices are generally formed on semiconductor substrates and are covered by insulating, or dielectric, materials.

For example, transistors are formed by implanting spaced-apart source/drain regions into the semiconductor substrate and forming control gates over the semiconductor substrate above the space between the source/drain regions. A dielectric is then deposited over the transistors. Since electrical connections need to be made to the source/drain regions and to the control gates, metal contacts are formed through the dielectric layer to the tops of the control gates and to the surface of the semiconductor substrate. Since the tops of the control gates and the surface of the semiconductor substrate are at different levels in the dielectric layer, the contacts are referred to as multi-level contacts, and more specifically as two-level contacts.

As the electronics industry seeks greater and greater numbers of semiconductor devices on a single integrated circuit, manufacturers seek better methods to shrink the devices by reducing device geometries or the size of features.

One new technology for shrinking device geometries is called "silicon-on-insulator" or SOI technology. SOI technology deals with the formation of semiconductor devices on a layer of semiconductor material which is over an insulating layer in a semiconductor substrate. A common embodiment of the SOI structure is a single active layer of silicon which overlies a layer of silicon dioxide insulator in a substrate silicon.

In the SOI technology, additional contacts are required to the substrate silicon, which is at a level below the tops of the control gates and the surface of the active layer of silicon. Therefore, SOI technology requires multi-level contacts, which are three-level contacts.

In forming multi-level contacts in SOI technology, an etch process is used with contact holes patterned to have the same diameter. The etch through the dielectric layer reaches the shallowest layer or the top of the gate earlier than the active silicon and much before reaching the deeper substrate silicon. Since the duration of the etch process needs to be sufficient to reach the deepest levels, significant over-etch occurs at the shallowest levels. To reduce over-etch, an underlayer or etch stop layer is provided over the gates, the source/drain regions, and the substrate silicon. The underlayer is either an etch stop dielectric layer or gate material (silicon/metal) and substrate silicon (active and/or SOI substrate).

However, immunity or selectivity of the underlayer to the etch is limited. As a result, a considerable portion of the underlayer is removed during long-duration over-etches. The required thickness of the underlayer is determined by the maximum over-etch and the etch rate of the underlayer, which is related to the selectivity. Multi-level contacts require much more over-etch than a single-level contact.

Unfortunately, the thickness of any underlayer is limited by geometric considerations. This is especially true for the CMOS technologies with very high gate densities. Since contacts to the active silicon are often made between two gates, the thickness of the underlayer needs to be less than one-half of the space between the gate sidewall spacers around the gates where the contact will be formed. If the thickness of the underlayer is greater than one-half the space, the underlayer portions of the two gates will "merge" and form an increased thickness of underlayer which will prevent proper etching.

Unfortunately also, if the etch requirement for a given underlayer thickness is above the maximum underlayer thickness allowed by the geometric considerations, then the multi-level contacts cannot be formed with a single etch process. This requires multiple etches and separate patterning for the different level contacts. For example, where two separate patterning steps are required, it will be necessary to mask for the shallow contacts, etch, mask for the deep contacts, and etch. This adds process complexity and cost.

While it is desirable to use a maximum thickness underlayer so as to be able to perform etching with comfortable process margins, this presents a problem. The underlayers usually employed are materials such as silicon nitride and silicon oxynitride, which have dielectric constants higher than the pre-metal dielectric layers. This results in increased parasitic capacitance in such areas as gate-to-contact, gate-fringing, and gate-to-first metal.

In some SOI technologies, no underlayer is used. In these situations, significant over-etch occurs on the active silicon during the multi-level contact etch and in particular down to the substrate silicon. Since selectivity to silicon is limited, this results in etching into the active silicon. Accurate control of the etching is required to avoid shorting out the source/drain regions. This requires greater process control and increased cost.

SOI technology offers the promises of improved device isolation, reduced region and parasitic capacitance, low power and enhanced performance but these problems prevent realization of the promises A solution to solve these problems has been long sought but has long eluded those in the art.

DISCLOSURE OF THE INVENTION

The present invention provides a method for forming an integrated circuit including etching a first opening to a first depth in a dielectric material over a semiconductor device on a first semiconductor substrate and etching a second opening to a second depth in the dielectric material over the first semiconductor substrate. The first and second openings are differently sized to respectively etch to the first and second depths in about the same time due to etch lag. The first and second openings are filled with conductive material. This method results in improved device isolation, reduced region and parasitic capacitance, low power requirements, and enhanced performance as well as less process control requirements and reduced manufacturing costs.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 5 is a view of a three-level etched contact structure as completed in accordance with the present invention; and FIG. 6 is a flowchart showing a method for forming an integrated circuit in accordance with the present invention.

BEST MODE FOR CARRYING OUT THE INVENTION

During a study of the multi-level contact problem, the inventors discovered that an undesirable phenomenon in the contact etching process could be used beneficially.

A phenomenon called "Aspect-Ratio Dependent Etching" (ARDE) causes different size features in a photoresist to etch at different rates in a dielectric layer. Under some processing conditions, features with smaller openings will etch slower than features having larger openings and under other processing conditions larger openings will etch slower than features having smaller openings.

For example, when using a reactive ion etch (RIE) in a plasma reactor to perform a plasma dry etch, the phenomenon known as "RIE lag" or etch lag will occur, especially if the feature sizes (openings in a photoresist) are below 0.25 $\mu$. With RIE lag, features with smaller openings etch in a dielectric material slower than features having large openings. This is undesirable because each etch step is generally intended to etch to a single depth regardless of feature size. Currently, those skilled in the art teach that the etch process should be optimized by minimizing RIE lag. When optimizing a plasma dry etch process for minimized RIE lag, usually there is some trade-off, which has to be made, e.g., lower selectivity to etch stopping layers.

The term "horizontal" as used in herein is defined as a plane parallel to the conventional plane or surface of a wafer or substrate, regardless of its orientation. The term "vertical" refers to a direction perpendicular to the horizontal as just defined. Terns, such as "on", "above", "below", "side" (as in "sidewall"), "higher", "lower", "over", "under", "shallow", and "deep", are defined with respect to the horizontal plane.

The term "processing" as used herein includes deposition of material or photoresist, patterning, exposure, development, etching, cleaning, and/or removal of the material or photoresist as required in forming a described structure.

Figure 1:
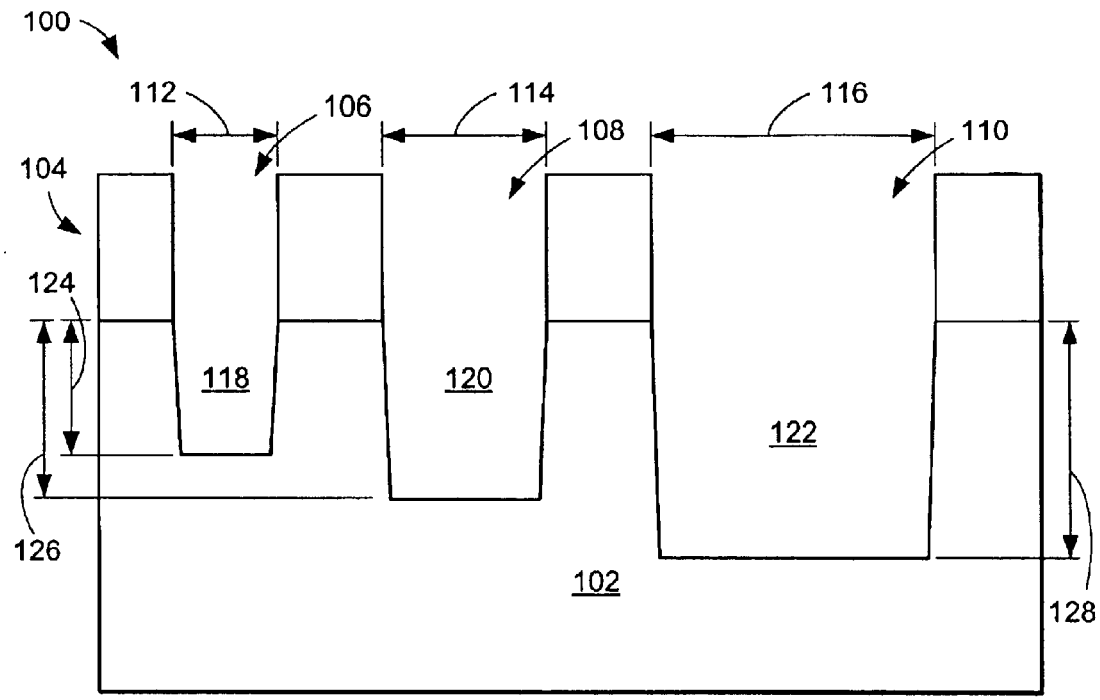
FIG. 1 is calibration structure for aspect-ratio dependent etching (ARDE) with an etchable material.

Referring now to FIG. 1, therein is shown a calibration structure 100 for Aspect-Ratio Dependent Etching (ARDE). A calibration dielectric material 102 has a photoresist 104 deposited thereon.

The photoresist 104 is processed to form a plurality of features over a range of sizes from a minimum photolithographic diameter to a multiple of this diameter; e.g., the minimum diameter could be 100 nm and the range could extend upwards to a maximum contact diameter of 1,000 nm. For purposes of illustration, first, second, and third openings 106, 108, and 110 are shown having a plurality of dimensions such as respective first, second, and third dimensions 112, 114, and 116. The dimensions of the features are sized such that the first dimension 112 is smaller than the second dimension 114, which is smaller than the third dimension 116; i.e., the third dimension 116 is larger than the second dimension 114, which is larger than the first dimension 112.

The dimensions of the features in the photoresist establish the starting dimensions of the features that will be etched into the calibration dielectric material 102.

In situations where the phenomenon of etch lag occurs, the first, second, and third openings 106, 108, and 110 will form respective first, second, and third features 118, 120, and 122 in the calibration dielectric material 102. During a single etch or a single period of time, the first, second, and third features 118, 120 and 122 will have respective first, second, and third depths 124, 126, and 128. ARDE is generally a non-linear effect. Since the features increase in size from the first dimension 112 to the third dimension 116, the depths increase from the first depth 124 to the third depth 128; i.e., larger features etch faster and reach greater depth during the same time.

While contact openings can be of various configurations, if the features were for cylindrical contact openings, the first, second, and third dimensions 112, 114, and 116 in the photoresist 104 would be diameters for the tops of the contact openings in the calibration dielectric material 102.

In most etch processes, the features taper slightly in size with depth in the calibration dielectric material 102 so the base of the contact holes are smaller in diameter than the tops.

Figure 2:
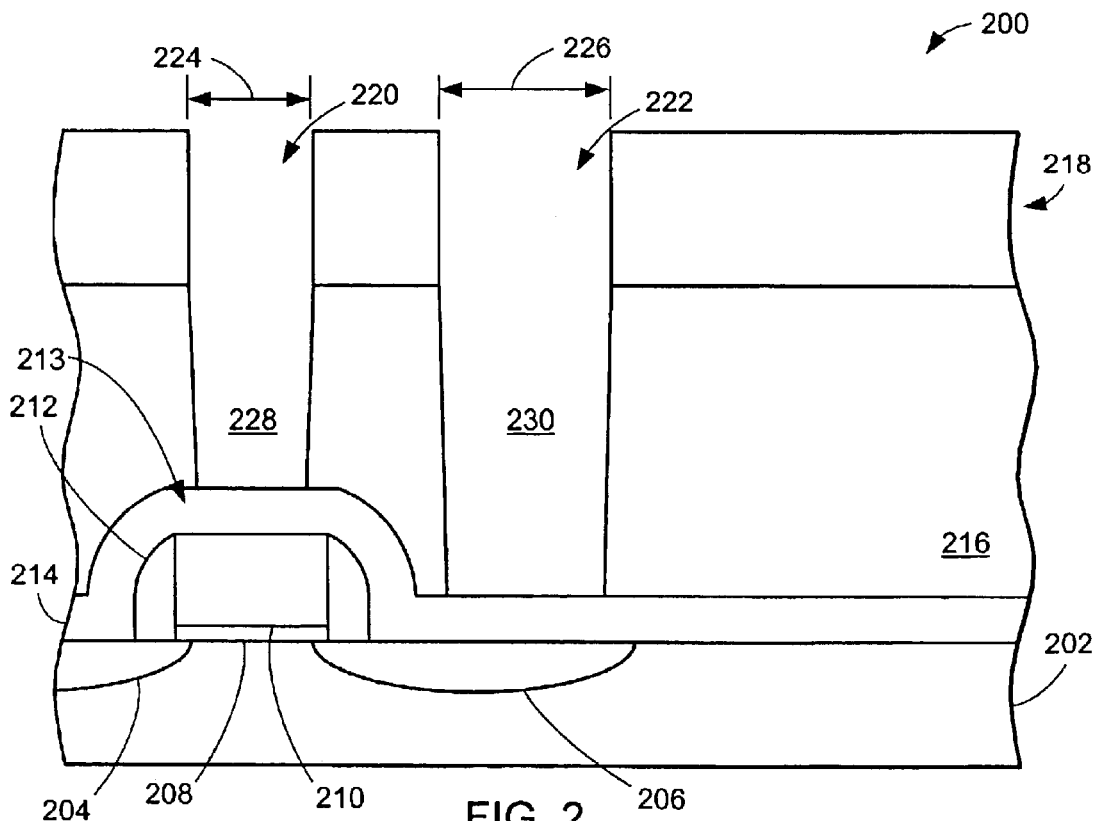
FIG. 2 is a view of a two-level etched contact structure in accordance with the present invention.

Referring now to FIG. 2, therein is shown a two-level etched contact structure 200 in accordance with the present invention.

A first semiconductor substrate 202 or substrate silicon is implanted with source/drain regions 204 and 206 having a gate dielectric 208 above a space between the source/drain regions 204 and 206. A gate 210 is above the gate dielectric 208 and is surrounded by a gate spacer 212 to form the upper portion of a semiconductor device 213. An underlayer 214 is disposed over the first semiconductor substrate 202 to cover the gate spacer 212 and the gate 210.

A pre-metal dielectric layer 216 is deposited over the underlayer 214 and a photoresist 218 is deposited over the pre-metal dielectric layer 216.

The photoresist 218 has been processed to form first and second openings 220 and 222 having first and second diameters 224 and 226. Using a single etch process for a fixed period of time, a gate contact 228 and a region contact 230 are formed which reach the underlayer 214 at about the same time with no or minimal over-etch into the underlayer 214.

In practice, first, the minimum contact diameter is established; e.g., the first diameter 224 for the gate contact 228. In practice, this value is often determined by the minimum opening that can be reliably resolved in a photoresist by the photolithography process in use. The minimum contact diameter is used for the shallowest level contact.

Second, the etch lag of the etch process is determined using the calibration structure 100 shown in FIG. 1 forming feature openings over a range of sizes from the minimum contact diameter to a multiple of this diameter; e.g., the minimum diameter could be 100 nm and the range could extend upwards to a maximum contact diameter of 1,000 nm.

Third, a timed etch is performed and the depths of the resulting etched openings are measured to calculate the etch lag according to the equation:

$$L = 1-(D_{min}/D) \quad \text{(Equation 1)}$$

where:

L=etch lag;

$D_{min}$=depth of the contact with the minimum diameter;

D=depth of a contact with a different diameter.

The etch lag above is not necessarily linear with diameter and depth.

Fourth, an optimal etch lag is calculated for the different contact depths desired on the final integrated circuit according to the equation:

$$L_{Optimal} = 1-(CD_{Shallow}/CD_{Deep}) \quad \text{Equation (2)}$$

where:

$L_{Optimal}$=optimal etch lag;

$CD_{Shallow}$=shallowest contact depth;

$CD_{Deep}$=deepest contact depth.

Fifth, using the smallest feature size, the calibration structure 100 is used to select feature opening sizes based on the desired etch depths where the feature etch lag is closest to the optimal etch lag. A diameter is selected to be a diameter that gives an etch lag closest to the optimal etch lag. With such a selection of the contact diameter, the etch process with reach the bottoms of both the shallow and deep contacts at about the same time.

Figure 3:
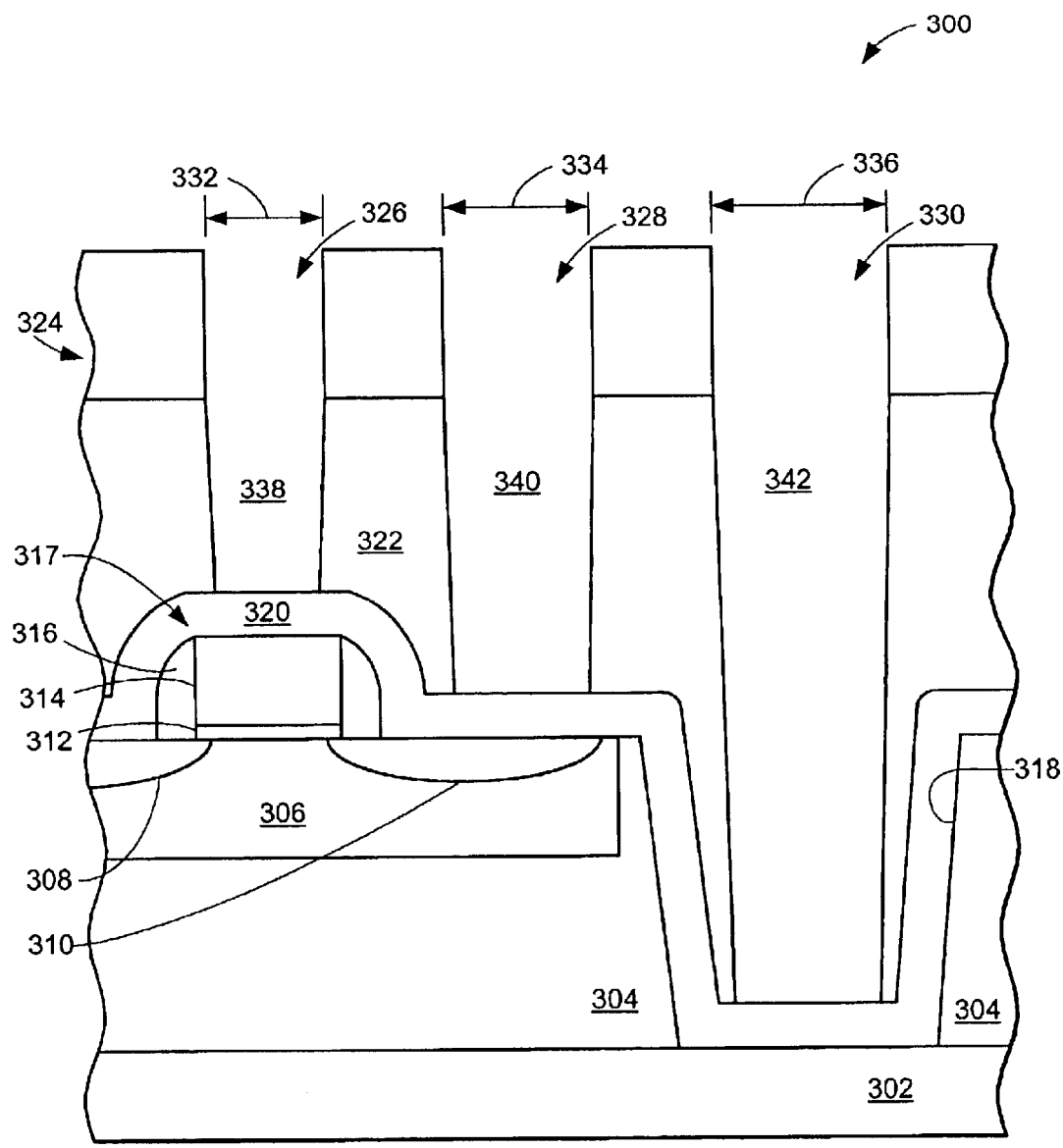
FIG. 3 is a view of a three-level etched contact structure in accordance with the present invention.

Referring now to FIG. 3, therein is shown a three-level etched contact structure 300 in accordance with the present invention.

A second semiconductor substrate 302 or substrate silicon has an insulator 304 deposited thereon containing first semiconductor substrate 306 or active silicon. The first semiconductor substrate 306 has implanted source/drain regions 308 and 310 implanted therein.

Above and over the source/drain regions 308 and 310 is a gate dielectric 312. Formed over the gate dielectric 312 is a gate 314 having a gate spacer 316 therearound to form the upper portion of a semiconductor device 317. A trench 318 has been etched into the insulator 304 and an underlayer 320 deposited to cover the insulator 304, the first semiconductor substrate 306, the gate spacer 316, and the gate 314.

A pre-metal dielectric layer 322 is deposited over the underlayer 320.

A photoresist 324 is deposited over the pre-metal dielectric layer 322 and processed to form first, second, and third contact openings 326, 328, and 330. The first, second, and third contact openings 326, 328, and 330 have respective first, second, and third diameters 332, 334, and 336. The first diameter 332 is smaller than the second diameter 334 and the second diameter 334 is smaller than the third diameter 336.

The three-level etched contact structure 300 has the optimal etch lag and contact diameter calculated separately for the very deep and the medium deep contact. The resultant contact sizing will allow the etch process for first, second, and third contact openings 338, 340, and 342 to reach the underlayer 320 at about the same time for all three contact depths. Thus the amount of over-etch required is minimized, which in turn keeps the required underlayer thickness at a minimum.

Figure 4:
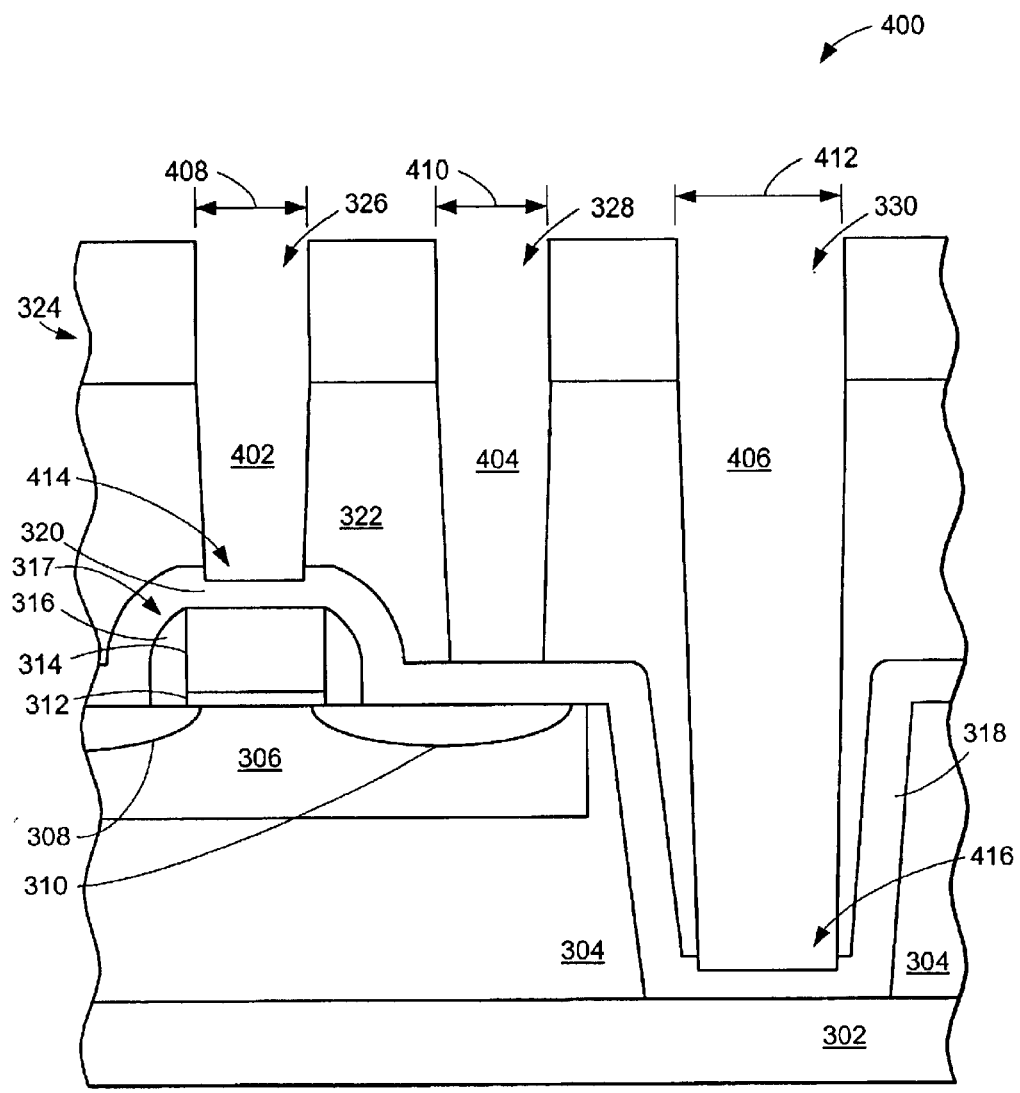
FIG. 4 is a view of an alternate embodiment of a three-level etched contact structure in accordance with the present invention.

Referring now to FIG. 4, therein is shown an alternate embodiment of a three-level etched contact structure 400 in accordance with the present invention. Elements, which are the same as in FIG. 3, have the same element numbers.

The three-level etched contact structure 400 has first, second, and third contact openings 402, 404, and 406 having respective first, second, and third diameters 408, 410, and 412. The first diameter 408 and the second diameter 410 have the same diameters. The second diameter 410 is smaller than the third diameter 412. The first and second diameters 408 and 410 are made the same diameter so as to simplify circuit layout and mask generation. At the same time, this may avoid increasing the die size for the integrated circuit.

With the distance between the first and second levels being minimal as compared to the third level, the etch process will proceed until the second contact opening 404 has reached the underlayer 320. At this point, it is to be expected that the first and third contact openings 402 and 406 will slightly over-etch into the underlayer 320 as indicated by first and third over-etches 414 and 416. This slight over-etch would be considered acceptable to obtain the benefits of having the first and second diameters 408 and 410 of the same diameter.

Referring now to FIG. 5, therein is shown a three-level etched contact structure 500 as completed in accordance with the present invention. The same elements, which are shown in FIG. 3, have the same element numbers.

After a selective etch to remove the remaining underlayer 320 from the contact openings 338, 340, and 342, the openings are filled with conductive material to form the first, second, and third contacts 502, 504, and 506. The first, second, and third contacts 502, 504, and 506 are respectively in contact with the gate 314, the first semiconductor substrate 306, and the second semiconductor substrate 302. The first, second, and third contacts 502, 504, and 506 have respective first, second, and third contact diameters 508, 510, and 512.

In various embodiments, the first, second, and third contacts 502, 504, and 506 are of refractory materials such as tantalum (Ta), titanium (Ti), tungsten (W), alloys thereof, and compounds thereof. If the contacts are of highly conductive materials such as copper (Cu), gold (Au), silver (Ag), alloys thereof, and compounds thereof with one or more of the above elements, the previously mentioned refractory materials will surround the highly conductive materials. The pre-metal dielectric layer 322 is of a dielectric material such as silicon oxide ($SiO_2$), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), benzocyclobutene (BCB), tetramethylorthosilicate (TMOS), octamethylcyclotetrasiloxane (OMCTS), hexamethyldisiloxane (HMDS), diacetoxyditertiarybutoxysilane (DADBS), etc. with dielectric constants below 3.9. The underlayer 320 (where used) is of a material such as silicon nitride ($Si_xN_x$) or silicon oxynitride (SiON).

Referring now to FIG. 6, therein is shown a flowchart showing a method 600 for forming an integrated circuit in accordance with the present invention. The method 600 includes: a step 602 of etching a first opening to a first depth in a dielectric material over a semiconductor device on a first semiconductor substrate; a step 604 of etching a second opening to a second depth in the dielectric material over the first semiconductor substrate, the first and second openings differently sized to respectively etch to the first and second depths in about the same time due to etch lag; and a step 606 of filling the first and second contact openings with conductive material.

While the invention has been described in conregion with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hithertofore set forth herein or shown in the accompanying drawings are to be interpreted in an illustrative and non-limiting sense.

What is claimed is:

1. A method for forming an integrated circuit comprising:
   depositing an underlayer over a first semiconductor substrate and a semiconductor device:
   etching a first opening to a first depth in a dielectric material over a semiconductor device to the underlayer over the first semiconductor substrate;
   etching a second opening to a second depth in the dielectric material to the underlayer over the first semiconductor substrate, the first and second openings differently sized to respectively etch to the first and second depths in about the same time due to etch lag;
   etching through the underlayer under the first and second openings; and
   filling the first and second openings with conductive material.

2. The method as claimed in claim 1 additionally comprising:
   sizing the second opening to the first opening to be non-linearly related to an etch lag of the second opening to an etch lag of the first opening.

3. The method as claimed in claim 1 additionally comprising:
   determining etch lags of a plurality of openings by:
      etching a plurality of openings in the dielectric material including a calibration opening sized to be the same as the first opening,
      measuring the plurality of depths from the etching of the plurality of openings, and
      calculating a plurality of etch lags being equal to the ratio of the calibration opening depth to the plurality of depths subtracted from one; and
   determining an optimal etch lag by:
      calculating the ratio of the first depth to the second depth subtracted from one; and
   sizing the second opening based on the size of the opening having the closest etch lag to the optimal etch lag.

4. The method as claimed in claim 1 additionally comprising:
   etching a third opening to a third depth in the dielectric material over a second semiconductor substrate under the first semiconductor substrate, the first, second, and third openings differently sized to respectively etch to the first, second, and third depths in about the same time; and
   filling the third opening with conductive material.

5. The method as claimed in claim 4 additionally comprising:
   sizing the third opening to the first opening to be non-linearly related to an etch lag of the third opening to an etch lag of the first opening.

6. The method as claimed in claim 4 additionally comprising:
   determining etch lags of a plurality of openings by:
      etching a plurality of openings in the dielectric material including a calibration opening sized to be the same as the first opening,
      measuring the plurality of depths, and
      calculating a plurality of etch lags being equal to the ratio of the calibration opening depth to the plurality of depths subtracted from one; and
   determining a first optimal etch lags by calculating the ratio of the first depth to the second depth subtracted from one;
   determining a second optimal etch lags by calculating the ratio of the fist depth to the third depth subtracted from one;
   sizing the second opening based on the size of the opening having the closest etch lag to the first optimal etch lag; and
   sizing the third opening based on the size of the opening having the closest etch lag to the third optimal etch lag.

7. A method for forming an integrated circuit comprising:
   depositing an underlayer over a first semiconductor substrate and a semiconductor device;
   etching a first opening to a first depth in a dielectric material over a semiconductor device to the underlayer over the first semiconductor substrate;
   etching a second opening to a second depth in the dielectric material to the underlayer over the first semiconductor substrate;
   etching a third opening to a third depth in the dielectric material over a second semiconductor substrate under the first semiconductor substrate, the first and second openings sized the same, and the third opening differently sized to respectively etch to the first, second, and third depths in about the same time;
   etching through the underlayer under the first, second and third openings; and
   filling the first, second, and third openings with conductive material.

8. The method as claimed in claim 7 additionally comprising:
   sizing the third opening to the second opening to be non-linearly related to an etch lag of the third opening to an etch lag of the second opening.

9. The method as claimed in claim 7 additionally comprising:
   determining etch lags of a plurality of openings by:
      etching a plurality of openings in the dielectric material including a calibration opening sized to be the sane as the first opening,
      measuring the plurality of depths from the etching of the plurality of openings, and
      calculating a plurality of etch lags being equal to the ratio of the calibration opening depth to the plurality of depths subtracted from one; and
   determining an optimal etch lag by:
      calculating the ratio of the second depth to the third depth subtracted from one; and
   sizing the third opening based on the size of the opening having the closest etch lag to the optimal etch lag.

10. A method for forming an integrated circuit comprising:
    depositing an underlayer over a first semiconductor substrate and a semiconductor device and under a dielectric layer;
    processing a photoresist over the dielectric material to form first and second openings;
    etching a semiconductor device contact opening using the first opening to a semiconductor device depth in the dielectric material to the underlayer over a semiconductor device on a first semiconductor substrate;
    etching a first semiconductor substrate contact opening using the second opening to a first semiconductor substrate depth in the dielectric material to the underlayer over the first semiconductor substrate, the semiconductor device and first semiconductor substrate contact openings having different diameters to respectively etch to the semiconductor device and first semiconductor substrate depths in about the same time due to etch lag;

removing the photoresist;

using the semiconductor device and first semiconductor substrate contact openings to etch through the underlayer to the respective semiconductor device and to the first semiconductor substrate; and filling the semiconductor device and first semiconductor substrate contact openings with conductive material to form semiconductor device and first semiconductor substrate contacts.

11. The method as claimed in claim 10 additionally comprising:

sizing the diameter of the first semiconductor substrate contact opening to the diameter of the semiconductor device contact opening to be non-linearly related to an etch lag of the first semiconductor substrate contact opening to an etch lag of the semiconductor device contact opening.

12. The method as claimed in claim 10 additionally comprising:

determining etch lags of a plurality of contact openings by:

processing a calibration photoresist over a calibration dielectric material to have a plurality of different dieter openings, etching a plurality of contact openings in the dielectric material using the plurality of different diameter openings including a calibration contact opening sized to be the same diameter as the semiconductor device contact opening, measuring the plurality of depths from the etching of the plurality of contact openings, and calculating a plurality of etch lags being equal to the ratio of the calibration contact opening depth to the plurality of depths subtracted from one; and determining an optimal etch lag by:

calculating the ratio of the semiconductor device depth to the first semiconductor substrate depth subtracted from one; and sizing the diameter of the first semiconductor substrate contact opening based on the diameter of the contact opening having the closest etch lag to the optimal etch lag.

13. The method as claimed in claim 10 wherein:

processing the photoresist forms a third opening; and additionally comprising:

etching a second semiconductor substrate contact opening using the third opening to a second semiconductor substrate depth in the dielectric material over a second semiconductor substrate under the first semiconductor substrate, the semiconductor device, first semiconductor substrate, and second semiconductor substrate contact openings having different diameters to respectively etch to the semiconductor device, first semiconductor substrate, and second semiconductor substrate depths in about the same time; and filling the second semiconductor substrate contact opening with conductive material to form a second semiconductor substrate contact.

14. The method as claimed in claim 10 additionally comprising:

sizing the diameter of the second semiconductor substrate contact opening to the diameter of the semiconductor device contact opening to be non-linearly related to an etch lag of the second semiconductor substrate contact opening to an etch lag of the semiconductor device contact opening.

15. The method as claimed in claim 10 additionally comprising:

determining etch lags of a plurality of contact openings by:

processing a calibration photoresist over a calibration dielectric material to have a plurality of different diameter openings;

etching a plurality of contact openings in the dielectric material using the plurality of different diameter openings including a calibration contact opening sized to be the same diameter as the semiconductor device contact opening, measuring the plurality of depths from the etching of the plurality of contact openings, and calculating a plurality of etch lags being equal to the ratio of the calibration contact opening depth to the plurality of depths subtracted from one; and determining a first optimal etch lags by calculating the ratio of the semiconductor device depth to the first semiconductor substrate depth subtracted from one;

determining a second optimal etch lags by calculating the ratio of the semiconductor device depth to the second semiconductor substrate depth subtracted from one;

sizing the diameter of the first semiconductor substrate contact opening based on the diameter of the contact opening having the closest etch lag to the first optimal etch lag; and sizing the diameter of the second semiconductor substrate contact opening based on the diameter of the contact opening having the closest etch lag to the third optimal etch lag.

16. A method for forming an integrated circuit comprising:

depositing an underlayer over the first and second semiconductor substrate and the semiconductor device;

etching a semiconductor device contact opening to a semiconductor device depth in a dielectric material over a semiconductor device on a first semiconductor substrate;

etching a first semiconductor substrate contact opening to a first semiconductor substrate depth in the dielectric material over the first semiconductor substrate;

etching a second semiconductor substrate contact opening to a second semiconductor substrate depth in the dielectric material over a second semiconductor substrate under the fist semiconductor substrate, the semiconductor device and first semiconductor substrate contact openings sized the same, and second semiconductor substrate contact openings differently sized to respectively etch to the semiconductor device, first semiconductor substrate, and second semiconductor substrate depths in about the same time;

etching the semiconductor device and second semiconductor substrate contact openings etches into the underlayer;

etching the first semiconductor substrate contact opening etches into the underlayer; and filling the semiconductor device, first semiconductor substrate, and second semiconductor substrate contact openings with conductive material.

17. The method as claimed in claim 16 additionally comprising:

sizing the second semiconductor substrate Contact opening to the first semiconductor substrate contact opening to be non-linearly related to an etch lag of the second semiconductor substrate contact opening to an etch lag of the first semiconductor substrate contact opening.

18. The method as claimed in claim 16 additionally comprising:

determining etch lags of a plurality of contact openings by:

etching a plurality of contact openings in the dielectric material including a calibration contact opening sized to be the same as the semiconductor device contact opening, measuring the plurality of depths from the etching of the plurality of contact openings, and calculating a plurality of etch lags being equal to the ratio of the calibration contact opening depth to the plurality of depths subtracted from one; and determining an optimal etch lag by:

calculating the ratio of the first semiconductor substrate depth to the second semiconductor substrate depth subtracted from one; and sizing the second semiconductor substrate contact opening based on the size of the contact opening having the closest ch lag to the optimal etch lag.

* * * * *

UNITED STATES PATENT AND TRADEMARK OFFICE
CERTIFICATE OF CORRECTION

PATENT NO. : 6,828,240 B2
DATED : December 7, 2004
INVENTOR(S) : Hellig et al.

It is certified that error appears in the above-identified patent and that said Letters Patent is hereby corrected as shown below:

<u>Column 8,</u>
Line 5, delete "fist" and insert therefor -- first --
Line 42, delete "sane" and insert therefor -- same --

Signed and Sealed this

Seventh Day of June, 2005

JON W. DUDAS
*Director of the United States Patent and Trademark Office*